United States Patent

Sorel et al.

[11] Patent Number: 5,970,836
[45] Date of Patent: Oct. 26, 1999

[54] MACHINE FOR PUNCHING A PRINTED CIRCUIT PLATE

[75] Inventors: Alain Sorel, Les Baux Saint Croix; Serge Charbonnier, Chambray, both of France

[73] Assignee: Automa-Tech, Val de Reuil, France

[21] Appl. No.: 08/891,231

[22] Filed: Jul. 10, 1997

[30] Foreign Application Priority Data

Jul. 15, 1996 [FR] France .................................. 96 08804

[51] Int. Cl.⁶ .................................................. B23D 19/00
[52] U.S. Cl. .............................. 83/481; 83/559; 483/29; 483/16; 72/442
[58] Field of Search ............................. 83/481, 559, 563, 83/566, 479, 552; 72/442; 483/1, 29

[56] References Cited

U.S. PATENT DOCUMENTS 4,829,375  5/1989  Alzmann et al. .
5,595,560  1/1997  Kamada ..................... 83/559

FOREIGN PATENT DOCUMENTS 0 287 986  10/1988  European Pat. Off. .

OTHER PUBLICATIONS

Gridless Printed Circuit Board Drilling Machine, IBM Technical Disclosure Bulletin, vol. 31, No. 11, Apr. 1989.

*Primary Examiner*—M. Rachuba
*Attorney, Agent, or Firm*—O'Melveny & Myers LLP

[57] ABSTRACT

The invention relates to a machine for punching a printed circuit plate. The machine comprises a plurality of punch blocks that are movable relative to the structure. Each block comprises a frame that is movable relative to the structure, displacement means for positioning each frame relative to the structure as a function of instructions received, a non-removable punch die secured to the moving frame and located beneath the plane corresponding to said plate, a punch tool support secured to said frame and disposed above the plane of said plate and positioned relative to the die, said support including means for removably receiving one of a plurality of punch tools adapted to the characteristics of said plate and for positioning said tool relative to the support, and means for controlling vertical displacement of said tool in said support.

7 Claims, 4 Drawing Sheets

MACHINE FOR PUNCHING A PRINTED CIRCUIT PLATE

The present invention relates to a machine for punching a printed circuit plate.

BACKGROUND OF THE INVENTION

There exist more and more sectors of economic activity that make use of ever more complex printed circuits in their products. The complication of these products has led to multilayer printed circuits becoming widespread. Such multilayer circuits are made up of a plurality of individual printed circuit plates which are subsequently fixed to one another, and electrical connections are also made between the various layers in order to obtain a complete multilayer printed circuit.

Because, since it is clearly necessary to stack the individual printed circuits with great accuracy in order to make up the final circuit, a need has arisen for implementing position-marking means on the individual inside printed circuit layers. This marking is usually formed by means of holes drilled through the insulating backing of the printed circuit at locations that are accurately defined relative to the plate and/or to the printed circuit formed thereon.

These positioning holes can be made in the insulating backing either before the conductor tracks are made, or else after they have been made. The act of drilling positioning holes runs the risk of giving rise to a certain amount of pollution because of the presence of dust on the surface of the insulating backing. This pollution naturally gives rise to poor quality deposition of conductors on the insulating backing. Thus trend is to make the positioning holes after the conductors have been made on the insulating backing.

Whichever of the two possible techniques is used, making the positioning holes by means of a machine requires the plate to be positioned initially relative to the structure of the machine, and then the punch tools to be positioned relative to said structure, so as to make the holes in the appropriate places.

The punching machines that are most frequently encountered at present require manual operations to be performed to position the punch tools relative to the printed circuit after the printed circuit has been positioned relative to the structure. When it is necessary to perform a large number of punching operations with different punching characteristics, such manual positioning is, naturally, very expensive.

That is why machines have been proposed in which the positioning of the punch tools is under program control. Nevertheless, in such machines, the operations that need to be performed to go from punching one type of printed circuit card to another type remain considerable and thus give rise to considerable losses of time, in spite of the pseudo-automatic way in which the punches are positioned. In particular, it is important to emphasize that even if positioning holes are, a priori, always of the same size, the punch tools, which are essentially constituted by a punch and a die, need to be adapted to the characteristics of the insulating backing of the printed circuit. In particular, the characteristics of the die and of the punch depend on the nature of the material constituting the insulating backing of the printed circuit and on the thickness of said insulating backing. It should be added that these manual operations of changing punches and dies give rise not only to a loss of time because of the operations themselves, but also require very accurate initial repositioning of the punch tools after a punch and die have been changed.

OBJECTS AND SUMMARY OF THE INVENTION

A real need therefore exists for a machine that makes it possible not only to displace punch tools automatically, but also to adapt them to different types of cards under conditions that enable replacement to be performed quickly and, in particular, that do not require any initial repositioning of the tools.

In addition, there is a need to enable the printed circuit plates that are to be punched to be loaded automatically, which is most favorable in terms of machine efficiency.

To achieve this object, the invention provides a machine for punching a printed circuit plate, the machine comprising:
a fixed structure;
an X, Y, and Θ positioning table for positioning the plate relative to the structure;
means for detecting prepositioning error of the plate;
means for controlling the table as a function of detected errors; and
a plurality of punch blocks, each punch block being movable relative to the structure and comprising:
a frame that is movable relative to the structure;
displacement means for positioning each frame relative to the structure as a function of instructions received;
a non-removable punch die secured to the moving frame and disposed beneath the plane corresponding to said plate;
a punch tool support secured to said frame and disposed above the plane of said plate and positioned relative to the die, said support including means for removably receiving one of a plurality of punch tools adapted to the characteristics of said plates and for positioning said tool relative to the support; and
means for controlling vertical displacement of said tool in said support.

In a preferred embodiment, each punch tool support comprises a bottom piece secured to the frame and pierced by a vertical bore for positioning and guiding the assembly constituted by the punch tool and the side holder, a top piece that is movable relative to said bottom piece to enable the tool to be put into place in the bore, said top piece including a hydraulic actuator suitable for acting on the head of the punch tool and an opening for feeding the actuator with fluid under pressure, and controllable locking means for locking the top piece on the bottom piece.

It will be understood that because of the structural characteristics of the punch tool support, it is very easy to replace the punch tool, and such replacement does not give rise to any loss of position reference for the punch block.

It will also be understood that because the hydraulic actuator which enables the movement of the punch tool to be controlled is disposed directly in said support, it is possible to lighten the punch block considerably, and it is highly independent compared with systems in which the punch tool control means are fixed and concern all of the punches.

BRIEF DESCRIPTION OF THE DRAWINGS

Other characteristics and advantages of the invention appear better on reading the following description of an embodiment of the invention given by way of non-limiting example. The description refers to the accompanying figures, in which.

MORE DETAILED DESCRIPTION

Figure 1:
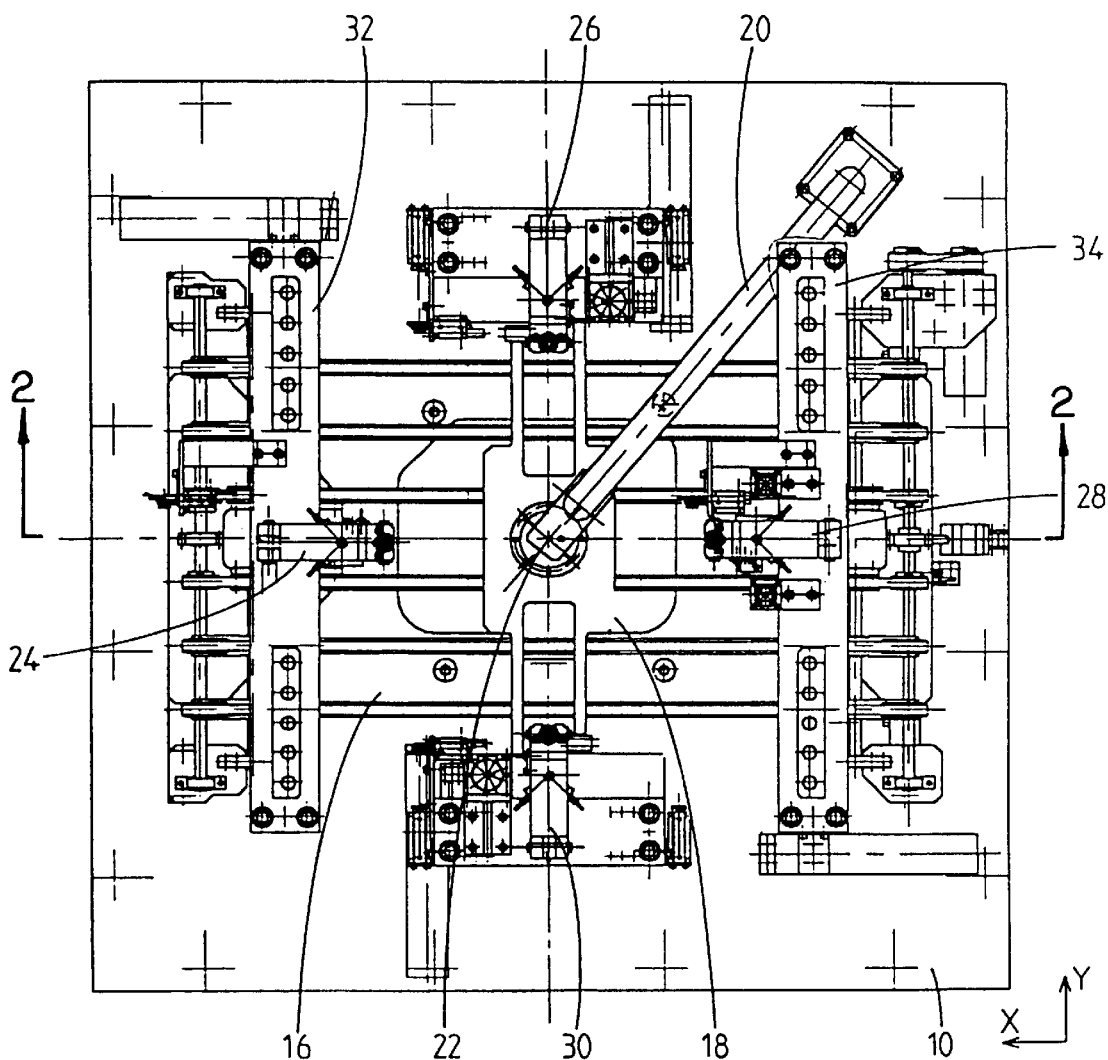
FIG. 1 is an overall plan view of the punching machine.
Figure 2:
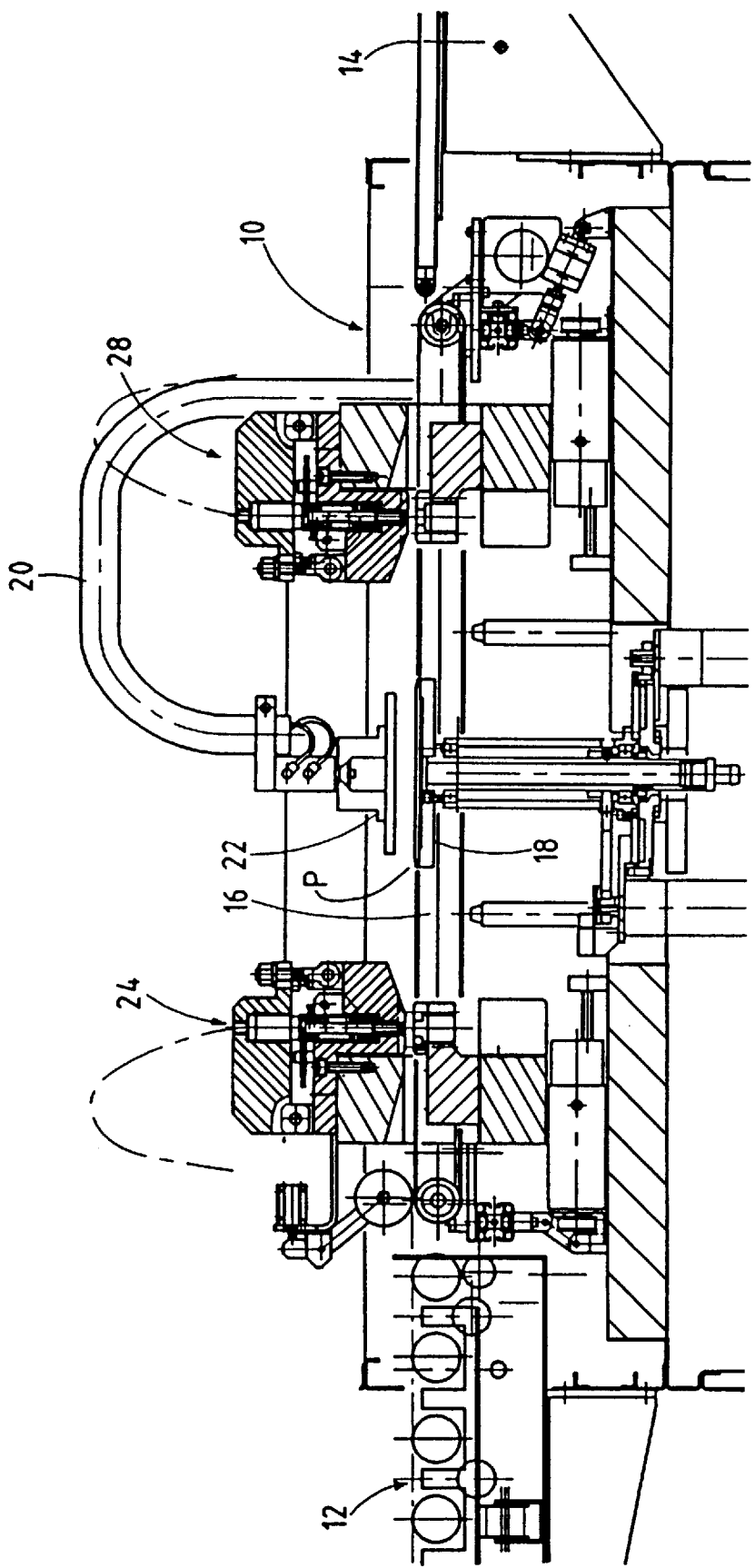
FIG. 2 is a vertical section view of the machine on line 2—2 of FIG. 1.

Referring initially to FIGS. 1 and 2, there follows a description of the overall organization of the punching machine.

The punching machine comprises a structure 10 and a conveyor 12 for bringing plates to be perforated, and also a conveyor 14 for removing plates after they have been perforated. A third conveyor disposed in the field of the structure of the machine, and referenced 16 serves to bring each plate into a prepositioning position which is defined by retractable abutments (not shown in the figure).

As is well known, the machine includes means for correcting prepositioning error. These means comprise optical detectors which enable a position error to be observed between references provided on the printed circuit card and references that are fixed relative to the machine. The optical detectors enable positioning error to be detected and the correct position of the printed circuit card is obtained by means of a moving table 18 which enables the card to be moved in orthogonal directions X and Y, and which also makes it possible to provide a correction by rotation. Such tables are well known per se so there is no need to describe them in greater detail. Temporary connection between the table and the plate during final positioning operations is obtained by means of a suction system. According to the invention, when the plate has been brought into its correct final position, pressure is applied on the central portion of the plate by means of a bracket 20 which enables the presser member 22 to be pressed against the top face of the plate, thereby also closing the holes that may be present through the card (internal layers).

In the embodiment described herein, the punching machine includes, in accordance with the invention, four punch blocks referenced 24, 26, 28, and 30. These four punch blocks are identical in structure. They differ from one another only by the means that enable them to move in the X direction or in the Y direction. In particular, as can be seen best in FIG. 1, the punch blocks 24 and 28 which are disposed in the printed circuit plate insertion direction A must naturally allow insertion of said plates as driven by the conveyor 16. For this purpose, the blocks 24 and 28 are mounted on gantries 32 and 34 which leave sufficient empty space to allow the printed circuit plates to pass through. In contrast, punch blocks 26 and 30 are mounted on XY tables of conventional type. There is therefore no need to describe the means for displacing the punch blocks in the X and Y directions in greater detail. It suffices to mention that X and Y movements are controlled by motors whose control circuits receive programmed instructions which enable each punch block to be brought into its required X position and Y position corresponding to the holes which are to be made in the printed circuit plate. It can thus already be understood that the machine is highly flexible since, by initial programming, it is possible to make holes in a plate at locations that differ from one plate to another. This disposition naturally makes it possible to increase the productivity of the machine while maintaining a high degree of flexibility for the machine.

In the embodiment described in detail, the punch blocks 24 and 28 which are disposed in the X direction, i.e. in the printed circuit plate insertion direction A, are thus mounted on the gantries 32 and 34 which leave the plates being brought to the work position room to move freely, and also leave them room to be extracted from the apparatus by the conveyor 16 which travels beneath the gantries 32 and 34. The gantries are capable of moving in the X direction only.

The punch blocks 26 and 30 which are disposed in the Y direction are situated on either side of the conveyor 16 and therefore do not interfere with displacements of the printed circuit cards. In this preferred embodiment, the punch blocks 26 and 30 are movable in the Y direction only.

Figure 3:
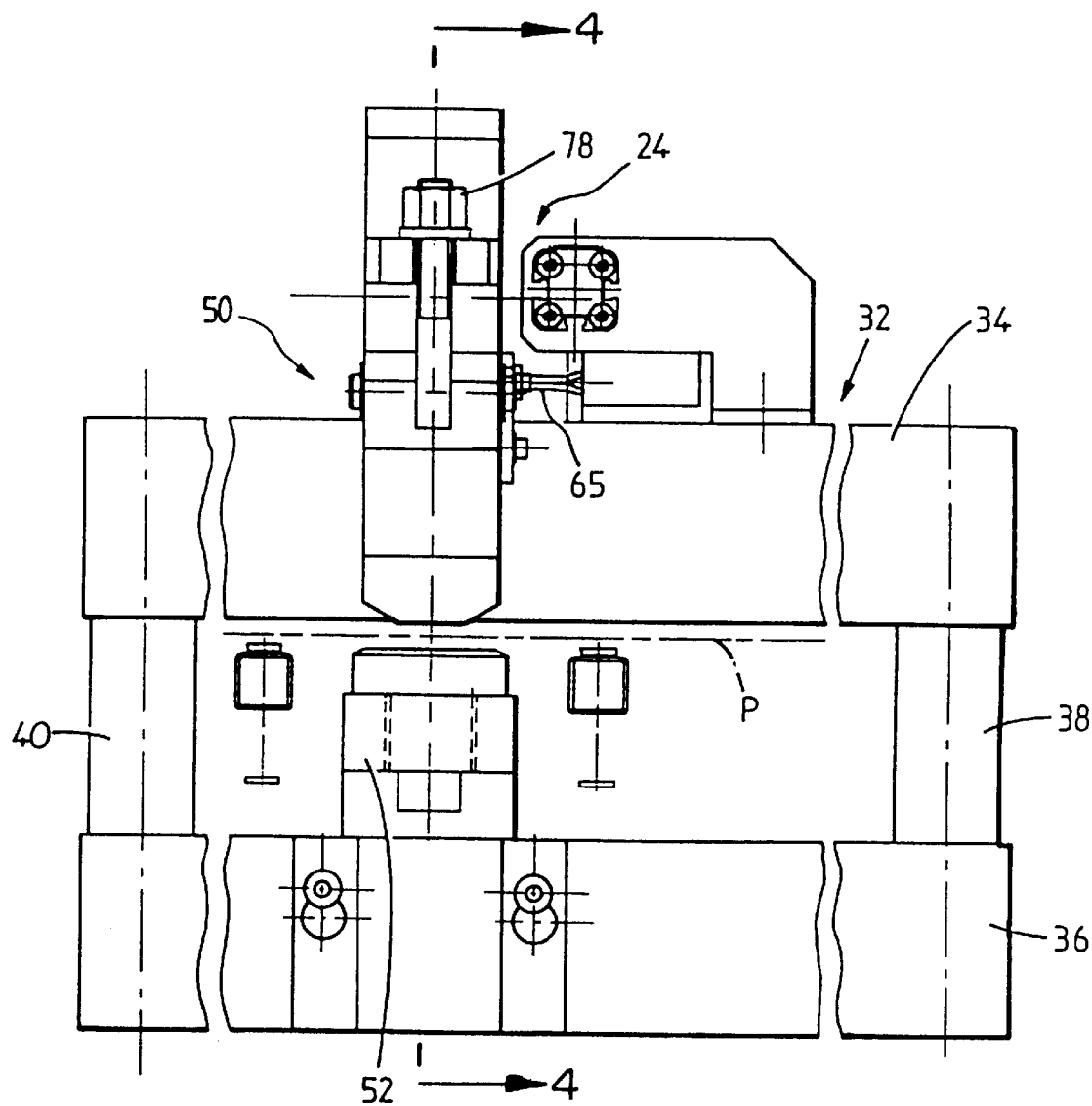
FIG. 3 is a fragmentary view of the machine showing a punch block in elevation.
Figure 4:
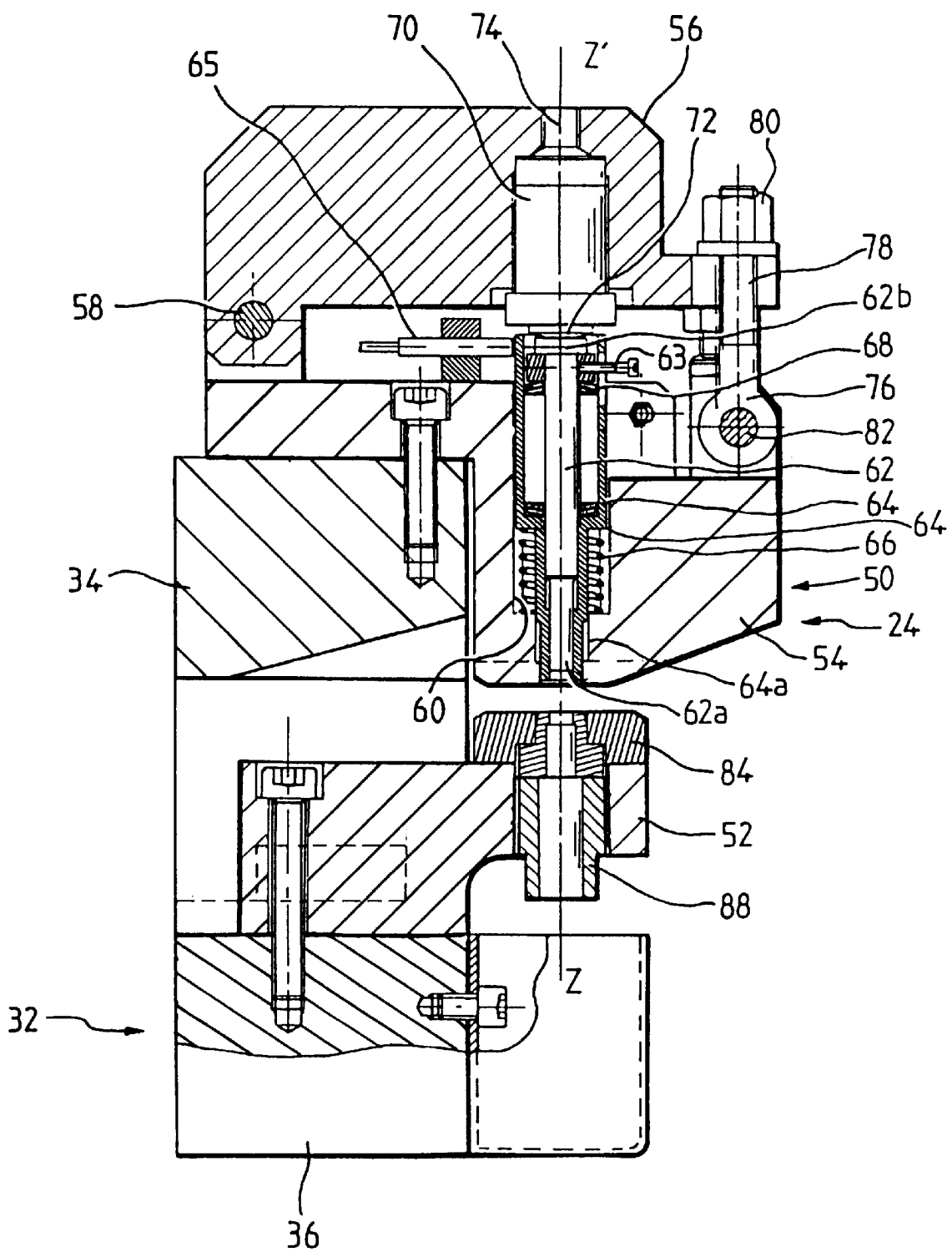
FIG. 4 is a vertical section on line 4—4 of FIG. 3.

With reference now to FIGS. 3 and 4, a preferred embodiment of a punch block is described in detail, e.g. the block 24. In FIGS. 3 and 4, there can be seen a gantry 32 on which the punch block 24 is mounted. The gantry has a top cross-member 34 and a bottom cross-member 36 which are interconnected by spacers 38 and 40 to allow the printed circuit plates to pass through. One such plate P is represented by a dashed line. The punch block 24 essentially comprises a punch tool support 50 and a die support 52. These two supports are secured to the top and bottom cross-members 34 and 36, respectively.

The tool support 50 is essentially constituted by a bottom piece 54 secured to the cross-member 34, and by a top piece 56 pivotally mounted relative to the piece 54 about a horizontal axis 58. The bottom piece 54 includes a stepped vertical bore 60 for positioning and guiding the punch tool 62 together with its cylindrical side holder 64. The punch 62 has a sharp bottom end 62a and a head 62b which projects beyond the bore. The punch 62 is surrounded by a side holder 64 which has an active end 64a surrounding the end 62a of the punch 62. The assembly constituted by the side holder 64 and the punch 62 is held in the raised position by a return spring 66. Similarly, a return spring 68 is interposed between the head 62b of the punch 62 and a shoulder 64b of the side holder 64.

With reference now to the top piece 56, it is essentially fitted with a hydraulic actuator 70 whose moving rod 72 is capable of acting on the head 62b of the punch 62 when the punch 62 is in its retracted position as shown in FIG. 4. The hydraulic actuator 70 is fed with liquid under pressure via a tube (not shown) connected to the actuator 70 via an orifice 74. A fastener 76 is constituted, for example, by a threaded rod 78 and a nut 80, with the end of the threaded rod being pivotally mounted about a horizontal axis 82. As is well known, it will be understood that it is easy to raise the top piece 56 by making it pivot about an axis 58. In this position, it is easy to extract the punch 62 in order to replace it with another punch adapted to the characteristics of the printed circuit plate.

The head 62b is preferably fitted with a special member 63 for identifying the type of punch. An optical detector 65 secured to the bottom piece 54 makes it possible to read the identification member 63 of the punch actually in place in the punch support. While the machine is being programmed, it is possible to make use not only of information relating to the positions of the holes that are to be made, as explained above, but also information relating to the characteristics of the printed circuit plate that is to be punched. As already mentioned, a specific type of punch is associated with these characteristics. If the optical detector 65 detects a punch that does not comply with the characteristics programmed for the plate, then operation of the machine is interrupted.

Reference is now made to the support 52 for the punch die, which comprises a top flange 84 for fixing the die proper 86, and a threaded part 88 for holding the die. Naturally, the axis of the die 86 and the axis of the punch 62, optionally together with the side holder, coincide accurately in the vertical direction ZZ'. It will naturally be understood that it is possible to change the die 86. However, the present invention differs from conventional punching machines in that the die 86 is functionally non-removable, insofar as the same die 86 is used regardless of the characteristics of the printed circuit plates that are to be punched. It is the particular combination of a punch and a side holder that makes it possible to achieve this result.

It will be understood that the punch can be changed easily by raising the top piece 56, and that does not change the overall position of the punch block in any way.

It can also be seen that each punch is fitted with its own control actuator 70, thereby considerably simplifying the architecture of the machine compared with conventional machines in which all of the punches are displaced by means of a single actuator system acting simultaneously on all of the punches.

It also appears clearly that the punch machine is particularly well adapted to being fed automatically with plates to be punched because of the particular way in which the punch blocks are mounted.

We claim:

1. A machine for punching a printed circuit plate, the machine comprising:

a fixed structure;

an X, Y, and Θ positioning table for positioning the plate relative to the structure;

means for detecting prepositioning error of the plate;

means for controlling the table as a function of detected errors;

a plurality of punch blocks being movable relative to the structure; and displacement means for separately positioning each one of said punch blocks relative to the structure; and a plurality of punch tools for use in the plurality of punch blocks, each one of said plurality of punch blocks further comprising:

a frame movable relative to the structure;

a non-removable punch die secured to the moving frame and disposed beneath a plane corresponding to said plate;

a punch tool support secured to said frame and disposed above the plane of said plate and positioned relative to the punch die, said support including means for removably receiving one of said plurality of punch tools adapted to certain characteristics of said plate and for positioning said one of said plurality of punch tools relative to the support; and means for individually controlling vertical displacement of said one of said plurality of punch tools in said support.

2. A machine according to claim 1, in which said punch tool further includes an annular side holder surrounding said tool, and in which said support is dimensioned for receiving and positioning an assembly comprising the side holder and the punch tool.

3. A machine according to claim 1, in which the means for displacing each punch block comprise means for defining a reference position of the block relative to the structure and means for displacing each block from its reference position to a position corresponding to the received positioning instructions.

4. A machine according to claim 2, wherein each said punch tool support comprises:

a bottom piece secured to the frame and pierced by a vertical bore for positioning and guiding said assembly;

a top piece that is movable relative to said bottom piece to enable the tool to be put into place in the bore, said top piece comprising a hydraulic actuator which controllably engages the head of the punch tool and an opening for feeding the actuator with fluid under pressure;

and controllable locking means for locking the top piece on the bottom piece.

5. A machine according to claim 4, in which said head of each punch tool includes an identification element identifying the characteristics thereof, and in which said tool support includes means for detecting the identification element.

6. A machine according to claim 1, comprising four punch blocks, two first blocks disposed in the direction in which printed circuit plates are inserted, and two other punch blocks disposed in a direction orthogonal to the insertion direction, the first two blocks being mounted on gantries allowing said plates to pass freely.

7. A machine according to claim 1, wherein at least one of said plurality of punch blocks is disposed in the direction in which printed circuit plates are inserted and is mounted on a gantry allowing said printed circuit plates to pass freely; and at least one of said plurality of punch blocks is disposed in a direction orthogonal to the insertion direction.

* * * * *